US006274951B1

(12) United States Patent
Saikalis et al.

(10) Patent No.: US 6,274,951 B1
(45) Date of Patent: Aug. 14, 2001

(54) EMI ENERGY ABSORBER

(75) Inventors: George Saikalis, West Bloomfield; Shigeru Oho, Farmington Hills, both of MI (US)

(73) Assignee: Hitachi America, Ltd., Tarrytown, NY (US)

( * ) Notice: Subject to any disclaimer, the term of this patent is extended or adjusted under 35 U.S.C. 154(b) by 0 days.

(21) Appl. No.: 09/305,699

(22) Filed: May 5, 1999

(51) Int. Cl.[7] .............................. H05K 9/00

(52) U.S. Cl. .................... 307/91; 73/204.23; 102/202.2; 333/12; 361/818

(58) Field of Search .......................... 307/91; 73/204.23, 73/204.11; 102/202.2; 333/12; 257/659, 660, 662; 361/818

(56) References Cited

U.S. PATENT DOCUMENTS 5,226,319 * 7/1993 Suzuki .............................. 73/204.23
5,490,030 * 2/1996 Taylor et al. .......................... 361/45
5,654,506 8/1997 Yoneda et al. .................... 73/204.11
5,796,323 * 8/1998 Uchikoba et al. .................. 333/260
5,905,226 * 5/1999 Baginski ........................... 102/202.2
5,969,583 * 10/1999 Hutchinson ............................ 333/12

* cited by examiner

*Primary Examiner*—Albert W. Paladini
(74) *Attorney, Agent, or Firm*—Gifford, Krass, Groh, Sprinkle, Anderson & Citkowski, P.C.

(57) ABSTRACT

An EMI energy absorber for use with an electrical circuit, such as a hot wire air flow sensor, which has at least one electrical element which exhibits antenna characteristics at a predetermined frequency range for the EMI. The energy absorber includes a component, such as a ferrite bead, which is electrically connected in series with the element of the electrical circuit. This component exhibits a resistance which varies as a function of frequency and has a maximum resistance within the predetermined frequency range. Thus, the component functions to absorb the EMI and dissipate the EMI as heat.

8 Claims, 3 Drawing Sheets

EMI ENERGY ABSORBER

BACKGROUND OF THE INVENTION

I. Field of the Invention

The present invention relates generally to an EMI energy absorber.

II. Description of the Prior Art

There are many electrical circuits, such as a hot wire air flow sensor for an internal combustion engine, which include components which exhibit antenna characteristics within predetermined frequency bands. For example, the posts for the hot and cold wire sensors of a hot wire air flow meter exhibit antenna characteristics typically in the frequency band of 500 MHz–1 GHz. Similarly, the pins on the electrical connector for the hot wire air flow sensor exhibit antenna characteristics in the frequency range of approximately 1–1.5 GHz while the wiring harness between the air flow sensor and its power supply typically exhibits antenna characteristics in the range of less than 100 MHz.

Electromagnetic interference (EMI) occurs from many different sources, such as radio frequency antennas, mobile telephones, radar, power lines and the like. Whenever the frequency of the EMI interacts with the resonant frequency of the components of the air flow meter which act as an antenna, the EMI is conducted to the various components of the air flow meter, such as the hot and cold wire sensors. Such EMI affects the overall output and current from the air flow sensor thus resulting in inaccurate readings from the air flow sensor. Such inaccurate readings, in turn, adversely affect the overall operation and emission output of the internal combustion engine associated with the air flow sensor.

SUMMARY OF THE PRESENT INVENTION

The present invention provides an energy absorber which overcomes the above-mentioned disadvantages of the previously known air flow sensors and other electronic circuits.

In brief, the present invention provides an energy absorber for use with an electrical circuit having at least one electrical element which exhibits antenna characteristics at a predetermined frequency range for the EMI. One such electrical circuit is an air flow sensor of the type used in internal combustion engines, although other types of electrical circuits are also adversely affected by EMI.

The absorber of the present invention comprises an electronic component which is electrically connected in series with the element exhibiting antenna characteristics. This component, furthermore, exhibits a resistance which varies as a function of frequency and is selected such that the component has a maximum resistance within the predetermined frequency range in which the element of the circuit exhibits antenna characteristics. As such, the component then absorbs the EMI and dissipates the EMI as heat.

In the preferred embodiment of the invention, the component exhibiting resistance which varies as a function of frequency comprises a ferrite bead although other components exhibiting a variable resistance as a function of frequency may alternatively be used. Furthermore, where at least two elements of the electrical circuit exhibit antenna-like characteristics, one component is electrically connected in series with each such element of the circuit. A capacitor is also preferably electrically connected between the two elements of the electrical circuit to stabilize the circuit and also conduct EMI in the predetermined frequency range for the EMI.

BRIEF DESCRIPTION OF THE DRAWING

A better understanding of the present invention will be had upon reference to the following detailed description when read in conjunction with the accompanying drawing, wherein like reference characters refer to like parts throughout the several views, and in which.

DETAILED DESCRIPTION OF A PREFERRED EMBODIMENT OF THE PRESENT INVENTION

Figure 1:
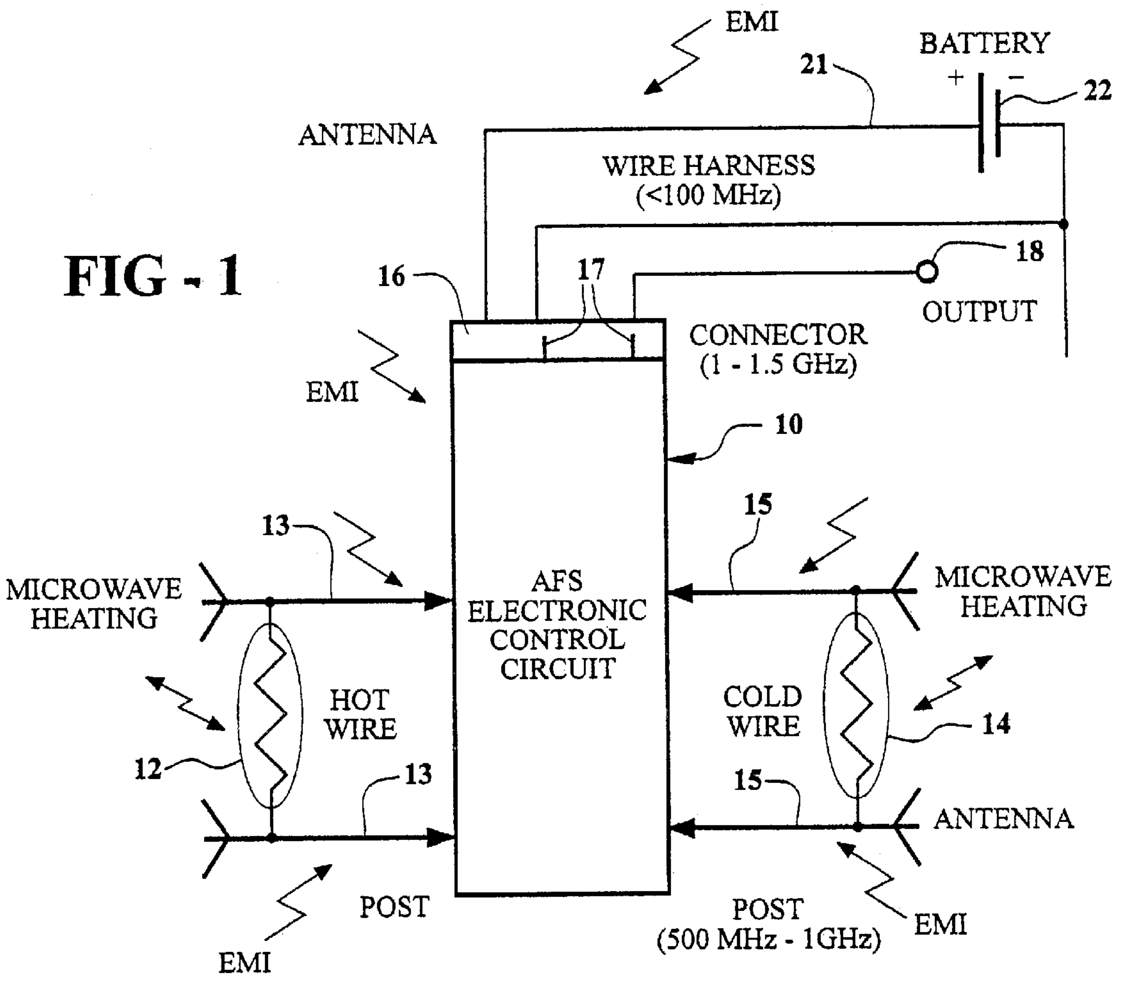
FIG. 1 is a schematic view illustrating an electrical circuit, such as a hot wire air flow-sensor.

With reference first to FIG. 1, a diagrammatic view of an electronic circuit, such as a hot wire air flow sensor 10, is there shown which can be adversely affected by electromagnetic interference (EMI). Such EMI occurs from many different sources, such as cellular telephones, radar, high voltage power lines, radio frequency transmissions and the like.

The hot wire air flow sensor 10 illustrated in FIG. 1 is of the type commonly used with internal combustion engines on automotive vehicles. The sensor 10 includes both a hot wire 12 and a cold wire 14, both of which are disposed in the air flow stream. Furthermore, in order to maintain the hot wire 12 and cold wire 14 in the air flow stream, the hot wire 12 and cold wire 14 are suspended by short metallic posts 13 and 15, respectively. The air flow sensor 10 also includes an electrical connector 16 which not only provides an output signal 18 from the air flow sensor 10, but is also connected by a wiring harness 21 to a power source 22. The posts 13 and 15 and pins 17 all exhibit antenna characteristics at EMI frequencies.

An exemplary energy absorber 20 will be described for use with the hot wire 12 and posts 13. It will be understood, however, that a similar description shall also apply to other components which exhibit antenna characteristics at EMI frequencies.

The posts 13 which hold the hot wire 12 are typically approximately 4 cm long in current hot wire air flow sensor design. When considering the antenna effects of posts 13, the wavelength (λ) divided by 20 is considered to represent the antenna characteristics or effects of the posts and pins.

For example, at 500 MHz, λ is 60 cm while $$\frac{\lambda}{20} = 7.5 \text{ cm.}$$

Similarly, at 1 GHz, λ equals 30 cm while $$\frac{\lambda}{20} = 1.5 \text{ cm.}$$

Consequently, for the hot and cold wire posts, the following applies:

$$\frac{\lambda 1 \text{ GHz}}{20} \leq Lp \leq \frac{\lambda 5 \text{ MHz}}{20}$$

Consequently, the posts 13 for the hot wire exhibit antenna characteristics in the range of approximately 500 MHz–1 GHz.

The connector pins and harness assembly 17 for the connector 16 are typically shorter than the posts 13 or 15. As such, the connector pins and harness assembly 17 exhibit antenna characteristics typically at a higher frequency range, for example 1–1.50 GHz.

Figure 2:
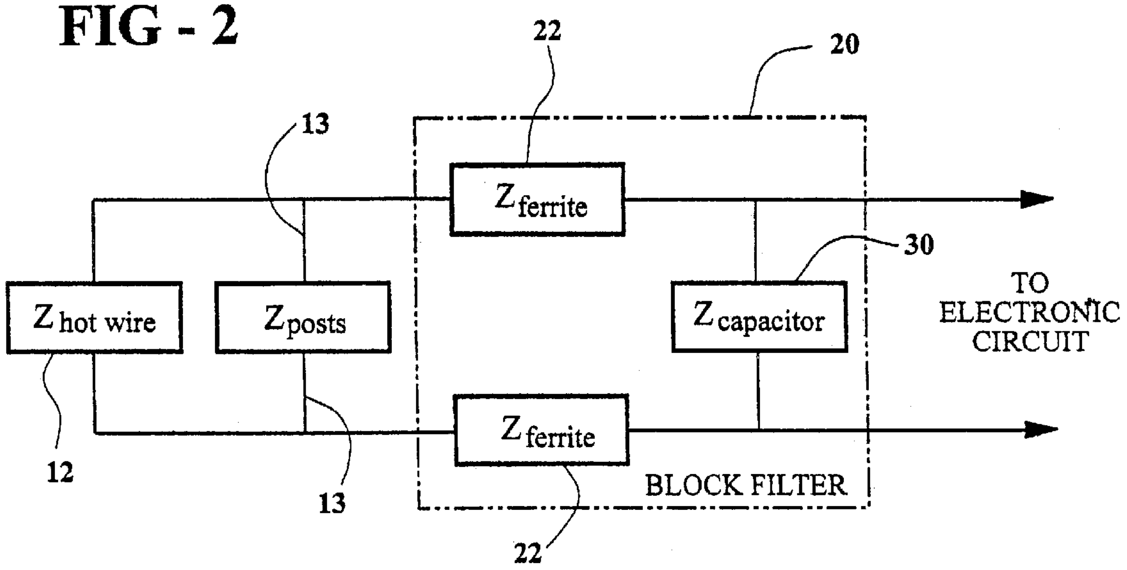
FIG. 2 is a block diagrammatic schematic view illustrating the preferred embodiment of the energy absorber of the present invention.

With reference now to FIG. 2, a preferred embodiment of the energy absorber 20 of the present invention is there shown for the hot wire 12 as well as the hot wire post 13. Similarly energy absorbers 20 are also used with the cold wire 14 and its post 15, as well as the connector pin 17 and any other elements of the air flow sensor 10 or other electrical circuit which exhibit antenna characteristics at high EMI frequencies.

Figure 3:
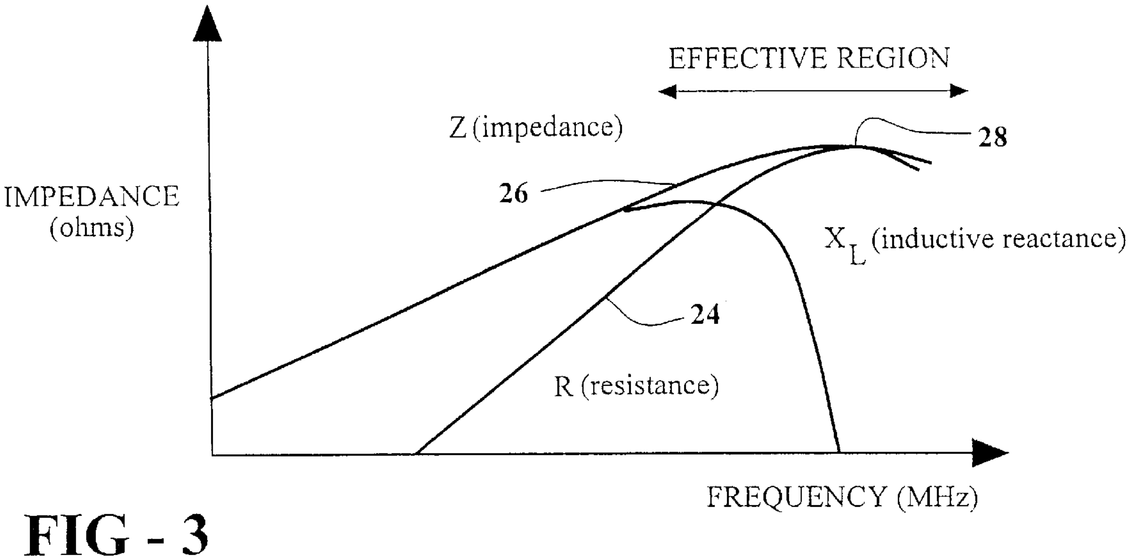
FIG. 3 is a graph illustrating impedance/resistive characteristics of a ferrite bead as function of frequency.

Still referring to FIG. 2, the energy absorber 20 preferably comprises an electrical component 22 in which the resistance varies as a function of frequency. The frequency characteristics of one such exemplary component, a ferrite bead, is illustrated in FIG. 3 in which the graph indicates the value of the resistance R and impedance Z as a function of the frequency. As shown in FIG. 3, the resistance R, as well as an impedance Z, reaches a maximum 28 at a predetermined frequency range.

With reference again to FIG. 2, one component 22 is electrically connected in series with each post 13. Similarly, a capacitor 30 is electrically connected between the components 22. The capacitor 30 serves not only to stabilize the entire circuit, but also acts to electrically short or filter out high frequency EMI.

Figure 4:
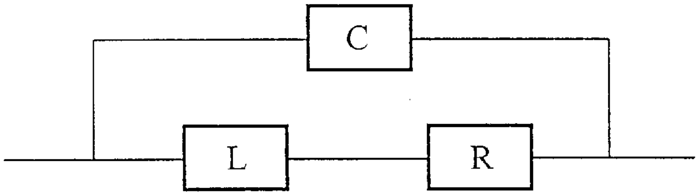
FIG. 4 is a schematic view of a hot wire frequency model (greater than 1 MHz)

By way of example only, a high frequency model for the post 13 of the hot wire 12 are illustrated in FIG. 4 so that the impedance of the hot wire 12 is determined as follows:

$$Z_{hotwire} = X_C \sqrt{\frac{R^2 + X_L^2}{R^2 + (X_L - X_C)^2}}$$

Figure 5:
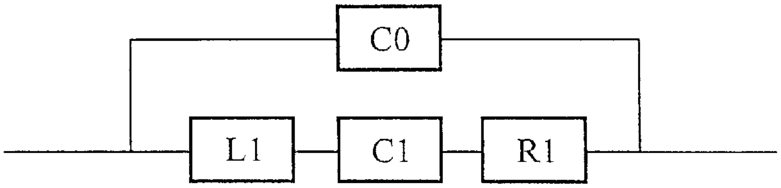
FIG. 5 is a schematic view of posts high frequency model (greater than 1 MHz)

Similarly, a model for the post 13 of the hot wire 12 is illustrated in FIG. 5 so that the impedance of the post 13 are determined as follows:

$$Z_{posts} = \frac{X0_C * \sqrt{R1^2 (X1_L - X1_C)^2}}{X0_C + \sqrt{R1^2 + (X1_L - X1_C)^2}}$$

Thus, the total impedance of the hot wire 12, post 13 and the energy absorber 20 is determined as follows:

$$Z_T = ((Z_{hotwire} // Z_{posts}) + 2Z_{ferrite}) // Z_{capacitor}$$

Figure 6:
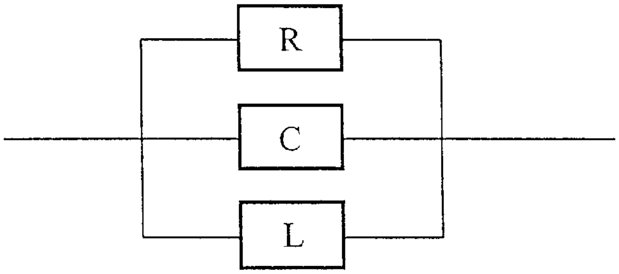
FIG. 6 is a schematic view of a ferrite bead or high value inductor high frequency model (greater than 1 MHz)

A high frequency model of the component 22 is illustrated in FIG. 6 where $$X_C = \frac{1}{2\pi f C} \text{ and}$$

$$X_L = 2\pi f L$$

Consequently, the impedance of the components 22 and their phase are determined as follows:

$$\text{Impedance: } Z_{ferrite} = \frac{R X_L X_C}{\sqrt{X_L^2 + X_C^2 + R^2 (X_L - X_2)^2}}$$

$$\text{Phase: } \theta = \tan^{-1} \frac{R(X_L - X_C)}{X_L X_C}$$

Since the impedance and resistance of the component 22 vary as a function of frequency, heat dissipation or power P of the component 22 is determined in accordance with the following formula:

$$P = i_{noise}^2 Z_{ferrite} \cos\theta$$

Figure 7:
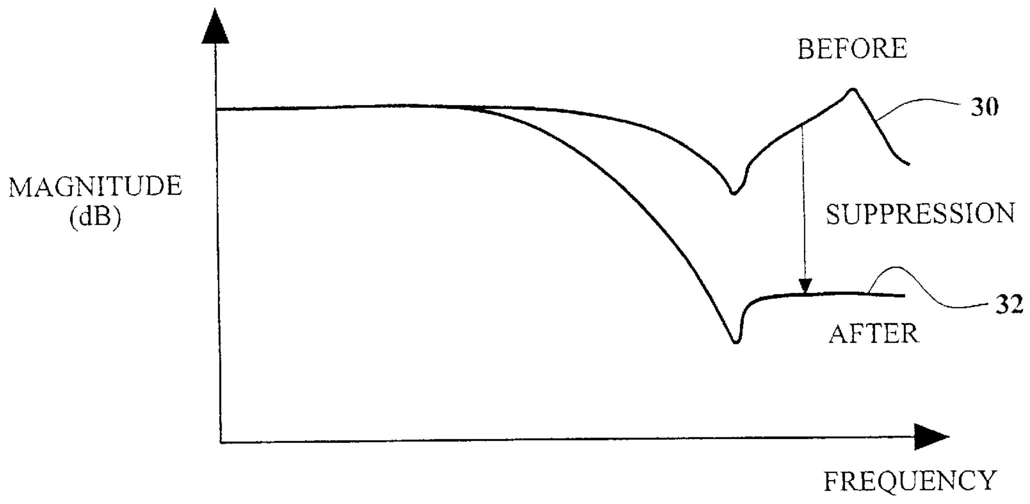
FIG. 7 is a graph illustrating the effects of the operation of the energy absorber of the present invention.

Electrical components in which the impedance and resistance varies as a function of resistance, such as ferrite beads, are available in a wide variety of resistive, capacitive and inductive characteristics. Consequently, as illustrated in FIG. 7, by proper selection of the ferrite bead such that the maximum value of the resistance of the ferrite bead is within the range that the electrical element, such as the hot wire post, exhibits antenna characteristics, EMI can be effectively attenuated. For example, in FIG. 7, graph 30 illustrates the magnitude of the EMI as a function of frequency without use of the energy absorber of the present invention while graph 32 illustrates EMI suppression as a function of frequency while using the energy absorber of the present invention.

Figure 8:
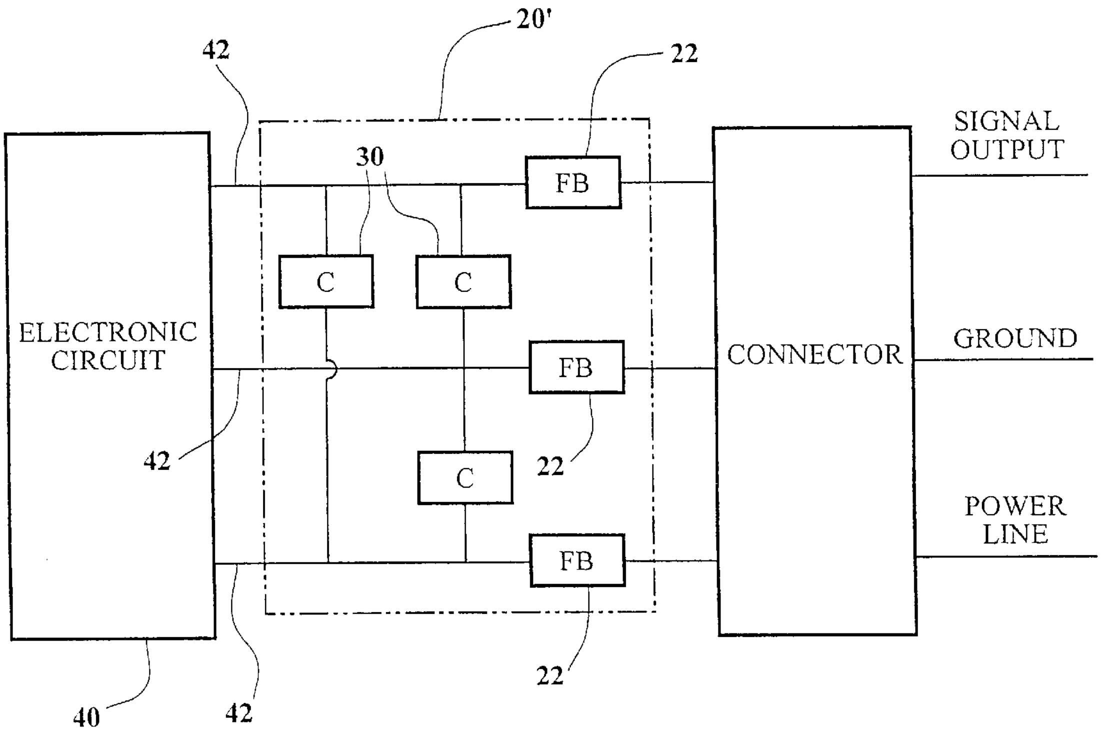
FIG. 8 is a schematic view similar to FIG. 2, but illustrating a modification thereof.

With reference now to FIG. 8, a modified energy absorber 20' is there shown for use with an electronic circuit 40 having three wires 42, each of which exhibits antenna characteristics at high frequency EMI. The energy absorber 20, unlike the energy absorber illustrated in FIG. 2, includes a component 22 in which the resistance and impedance varies as a function of frequency in series with each wire 42. Unlike the circuit of FIG. 2, however, the energy absorber 20' includes one capacitor 30 electrically connected between each pair of wires 42 so that three separate capacitors 30 are used. These three separate capacitors form a delta configuration and, like the capacitor 30 in FIG. 2, serve to both stabilize the overall electronic circuit and also electrically short or filter high frequency EMI.

From the foregoing, it can be seen that the present invention provides a novel energy absorber for absorbing and dissipating as heat EMI. Furthermore, the components 22 and capacitor 30 for the energy absorbers are selected to match the frequency range in which the electrical elements of the electrical circuit 10, such as a hot wire air flow sensor, connector, wiring harness, etc. exhibit antenna characteristics.

Having described our invention, however, many modifications thereto will become apparent to those skilled in the art to which it pertains without deviation from the spirit of the invention as defined by the scope of the appended claims.

What is claimed is:

1. An EMI energy absorber for use with an electrical circuit and at least one electrical element which exhibits antenna characteristics at a predetermined frequency range for the EMI comprising: a component electrically connected in series between said at least one electrical element and the electrical circuit, said component exhibiting a resistance which varies as a function of frequency, said component having a maximum resistance at an intermediate frequency within said predetermined frequency range.

2. The invention as defined in claim 1 wherein said component comprises a ferrite bead.

3. The invention as defined in claim 1 wherein one of said components is connected in series with each of said electrical elements.

4. The invention as defined in claim 3 and comprising a capacitor electrically connected between said components.

5. The invention as defined in claim 1 wherein said components convert EMI in said frequency range into heat.

6. The invention as defined in claim 1 and comprising three electrical elements, an electrical component connected in series with each element, and three capacitors, one capacitor being electrically connected between each pair of electrical elements.

7. An EMI energy absorber for use with an air flow sensor circuit and at least one electrical element which exhibits antenna characteristics at a predetermined frequency range for the EMI comprising:

a component electrically connected in series between said at least one electrical element and the air flow sensor circuit, said component exhibiting a resistance which varies as a function of frequency, said component having a maximum resistance within said predetermined frequency range.

8. The invention as defined in claim 7 wherein said component comprises a ferrite bead.

* * * * *

UNITED STATES PATENT AND TRADEMARK OFFICE

CERTIFICATE OF CORRECTION

PATENT NO. : 6,274,951 B1 Page 1 of 1
DATED : August 14, 2001
INVENTOR(S) : George Saikalis and Shigeru Oho It is certified that error appears in the above-identified patent and that said Letters Patent is hereby corrected as shown below:

Column 3,
Line 10, in the latter part of the formula, replace " $\frac{\lambda 5\ \text{MHz}}{20}$ " with -- $\frac{\lambda 500\ \text{MHz}}{20}$ --

Signed and Sealed this

Fourteenth Day of May, 2002

Attest:

JAMES E. ROGAN
*Director of the United States Patent and Trademark Office*

*Attesting Officer*